(12) United States Patent
Glenn et al.

(10) Patent No.: US 6,784,534 B1
(45) Date of Patent: Aug. 31, 2004

(54) THIN INTEGRATED CIRCUIT PACKAGE HAVING AN OPTICALLY TRANSPARENT WINDOW

(75) Inventors: Thomas P. Glenn, deceased, late of Gilbert, AZ (US), by Jeanice Glenn, legal representative; Vincent Di Caprio, Mesa, AZ (US); Steven Webster, Taipei (TW)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/067,068

(22) Filed: Feb. 6, 2002

(51) Int. Cl.⁷ .............................................. H01L 23/48

(52) U.S. Cl. ...................................... 257/704; 257/778

(58) Field of Search ................................ 257/704, 433, 257/414, 749

(56) References Cited

U.S. PATENT DOCUMENTS

| | | |
|---|---|---|
| 3,018,689 A | 1/1962 | Saxe |
| 3,838,984 A | 10/1974 | Crane et al. |
| 4,293,190 A | 10/1981 | Clover |
| 4,691,225 A | 9/1987 | Murakami et al. |
| 4,760,440 A * | 7/1988 | Bigler et al. ................... 357/74 |
| 4,801,998 A | 1/1989 | Okuaki |
| 5,057,905 A | 10/1991 | Matsumoto et al. |
| 5,070,041 A | 12/1991 | Katayama et al. |
| 5,117,279 A | 5/1992 | Karpman |
| 5,122,862 A | 6/1992 | Kajihara et al. |
| 5,159,432 A | 10/1992 | Ohkubo et al. |
| 5,230,759 A | 7/1993 | Hiraiwa |
| 5,256,901 A | 10/1993 | Ohahi et al. |
| 5,258,094 A | 11/1993 | Furui et al. |
| 5,336,931 A | 8/1994 | Juskey et al. |
| 5,347,429 A | 9/1994 | Kohno et al. |
| 5,435,057 A | 7/1995 | Bindra et al. |
| 5,436,203 A | 7/1995 | Lin |
| 5,463,253 A | 10/1995 | Waki et al. |

(List continued on next page.)

FOREIGN PATENT DOCUMENTS

| | | |
|---|---|---|
| DE | 43 19 786 A1 | 6/1993 |
| EP | 9510862026 A2 | 6/1995 |
| JP | 53-127101 | 10/1978 |
| JP | 54-095006 | 7/1979 |
| JP | 56-209264 | 12/1981 |
| JP | 58-040579 | 3/1983 |
| JP | 60-160257 | 7/1985 |
| JP | 60-288127 | 12/1985 |
| JP | 61-273445 | 11/1986 |
| JP | 62-185911 | 7/1987 |
| JP | 62-211993 | 8/1987 |
| JP | 05136323 A | 1/1993 |
| JP | 05109975 A | 3/1993 |
| JP | 06-102369 | 5/1994 |
| JP | 59-167037 A | 9/1994 |
| JP | 07-110380 | 5/1995 |
| JP | 08-124888 | 5/1996 |
| JP | 10-173085 | 6/1998 |

*Primary Examiner*—Kamand Cuneo
*Assistant Examiner*—Lourdes Cruz
(74) *Attorney, Agent, or Firm*—Gunnison, McKay & Hodgson, L.L.P.; Serge J. Hodgson

(57) ABSTRACT

A thin integrated circuit package having an optically transparent window provides a small profile optical integrated circuit assembly for use in digital cameras, video cellular telephones and other devices requiring a small physical size and optical integrated circuit technology. A tape having a conductive metal layer on a surface is used to interface the optical integrated circuit die with electrical interconnects disposed on a surface of the tape opposite the die. A supporting structure surrounds the die and a glass cover is either bonded to the top of the supporting structure over the die, or the glass cover is bonded to the top of the die and the gap between the glass cover and supporting structure filled with encapsulant. The resulting assembly yields a very thin optical integrated circuit package.

14 Claims, 1 Drawing Sheet

U.S. PATENT DOCUMENTS

| | | | | |
|---|---|---|---|---|
| 5,474,957 A | | 12/1995 | Urushima | |
| 5,474,958 A | | 12/1995 | Djennas et al. | |
| 5,497,032 A | | 3/1996 | Tsuji et al. | |
| 5,529,959 A | | 6/1996 | Yamanaka | |
| 5,579,164 A | | 11/1996 | Chapnik | |
| 5,581,498 A | | 12/1996 | Ludwig et al. | |
| 5,644,169 A | | 7/1997 | Chun | |
| 5,656,857 A | | 8/1997 | Kishita | |
| 5,674,785 A | | 10/1997 | Akram et al. | |
| 5,739,581 A | | 4/1998 | Chillara et al. | |
| 5,739,585 A | | 4/1998 | Akram et al. | |
| 5,776,798 A | | 7/1998 | Quan et al. | |
| 5,798,014 A | | 8/1998 | Weber | |
| 5,821,532 A | * | 10/1998 | Beaman et al. | 250/239 |
| 5,835,355 A | | 11/1998 | Dordi | |
| 5,859,471 A | | 1/1999 | Kuraishi et al. | |
| 5,861,680 A | | 1/1999 | Yamanaka | |
| 5,866,953 A | | 2/1999 | Akram et al. | |
| 5,867,368 A | | 2/1999 | Glenn | |
| 5,877,043 A | | 3/1999 | Alcoe et al. | |
| 5,877,546 A | | 3/1999 | You | |
| 5,893,723 A | | 4/1999 | Yamanaka | |
| 5,894,108 A | | 4/1999 | Mostafazadeh et al. | |
| 5,895,222 A | | 4/1999 | Moden et al. | |
| 5,903,052 A | | 5/1999 | Chen et al. | |
| 5,905,301 A | | 5/1999 | Ichikawa et al. | |
| 5,949,655 A | * | 9/1999 | Glenn | 361/783 |
| 5,950,074 A | | 9/1999 | Glenn et al. | |
| 5,952,611 A | | 9/1999 | Eng et al. | |
| 5,962,810 A | | 10/1999 | Glenn | |
| 5,972,738 A | | 10/1999 | Vongfuangfoo et al. | |
| 5,981,314 A | | 11/1999 | Glenn et al. | |
| 5,989,941 A | | 11/1999 | Wensel | |
| 5,998,862 A | | 12/1999 | Yamanaka | |
| 6,011,294 A | * | 1/2000 | Wetzel | 257/434 |
| 6,013,948 A | | 1/2000 | Akram et al. | |
| 6,034,427 A | | 3/2000 | Lan et al. | |
| 6,034,429 A | * | 3/2000 | Glenn et al. | 257/701 |
| 6,060,778 A | | 5/2000 | Jeong et al. | |
| 6,072,243 A | | 6/2000 | Nakanishi | |
| 6,092,281 A | | 7/2000 | Glenn | |
| 6,117,705 A | | 9/2000 | Glenn et al. | |
| 6,122,171 A | | 9/2000 | Akram et al. | |
| 6,127,833 A | | 10/2000 | Wu et al. | |
| 6,130,448 A | * | 10/2000 | Bauer et al. | 257/222 |
| 6,147,389 A | * | 11/2000 | Stern et al. | 257/434 |
| 6,160,705 A | | 12/2000 | Stearns et al. | |
| 6,172,419 B1 | | 1/2001 | Kinsman | |
| 6,184,463 B1 | | 2/2001 | Panchou et al. | |
| 6,214,641 B1 | | 4/2001 | Akram | |
| 6,235,554 B1 | | 5/2001 | Akram et al. | |
| 6,262,479 B1 | * | 7/2001 | Chou | 257/704 |
| 6,266,197 B1 | | 7/2001 | Glenn et al. | |
| 6,268,654 B1 | * | 7/2001 | Glenn et al. | 257/704 |
| 6,274,927 B1 | | 8/2001 | Glenn | |
| 6,395,578 B1 | | 5/2002 | Shin et al. | |
| 6,403,881 B1 | * | 6/2002 | Hughes | 174/52.3 |
| 6,528,892 B2 | * | 3/2003 | Caletka et al. | 257/781 |

* cited by examiner

THIN INTEGRATED CIRCUIT PACKAGE HAVING AN OPTICALLY TRANSPARENT WINDOW

FIELD OF THE INVENTION

The present invention relates generally to integrated circuit packaging, and more specifically, to a thin integrated circuit package having an optically transparent window.

BACKGROUND OF THE INVENTION

Optical integrated circuits are increasing in use to provide imaging, coupling and other optical functions for devices such as digital cameras, video cellular telephones, and other devices.

Digital cameras and cellular telephones are being fabricated in increasingly smaller and thinner packages, increasing market pressure on the semiconductor and subassembly manufacturers to supply thinner and smaller integrated circuit packages.

Optical integrated circuits are necessarily manufactured with a transparent cover that provides access to the optical functions on the integrated circuit die, while protecting the die from contamination and damage. Typically, the transparent cover is incorporated within a molded covering a lead frame carrier, yielding a thick industry-standard package.

Therefore, it would be desirable to provide a thin integrated circuit package incorporating an optically transparent window.

SUMMARY OF THE INVENTION

The objective of providing a thin integrated circuit having an optically transparent window is accomplished in an integrated circuit assembly and a method for manufacturing an integrated circuit assembly.

An integrated circuit die is mounted on a tape having metal conductors on its surface and electrical interconnects disposed on a side opposite the die. The interconnects may be solder balls or other suitable electrical mounting interconnects. The die is surrounded by a thin supporting structure to which the tape is mounted. A glass cover is mounted over the die, to either the supporting structure or to the top of the die.

The present invention is best understood by reference to the following detailed description when read in conjunction with the accompanying drawings.

DETAILED DESCRIPTION

Figure 1:
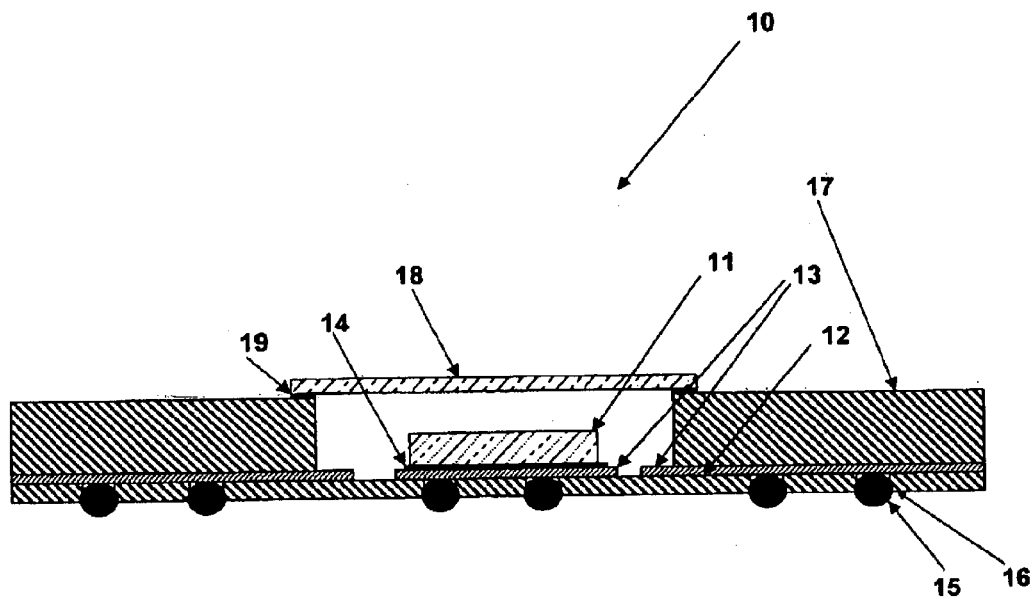
FIG. 1 depicts a cross section of an integrated circuit package in accordance with an embodiment of the present invention.

Referring to FIG. 1, in integrated circuit package 10 in accordance with an embodiment of the present invention is depicted. Integrated circuit package 10, is a thin optical integrated circuit package, suitable for use in digital cameras, video cellular telephones and other devices where thickness of integrated circuits within the devices is critical.

A die 11 is mounted within an aperture in a support structure 17, which is bonded by an adhesive 14 to a flexible plastic tape 12 having metal conductors 13 disposed thereon. The use of tape 12, which is generally a polyimide tape having an etched copper conductive pattern on a top side, provides a very thin package for the integrated circuit. The tape-die assembly is supported by a support structure 17, which may be a very thin stamped metal sheet, a B-staged epoxy film, or other material suitable for providing stiffness to integrated circuit package 10. The combination of tape 12 and support structure 17 eliminate the need for the substrate typically used in prior-art optical integrated circuits, reducing the thickness of the optical integrated circuit substantially.

A transparent cover 18 is mounted over the optically active surface of die 11 by bonding transparent cover 18 to the top surface of support structure 17 using an adhesive 19. The electrical interface to die 11 is provided by a plurality of solder balls forming a ball grid array on the bottom side of tape 12.

In general, an optical integrated circuit package having a thickness less than 0.05 inches may be achieved using the above-described method and assembly. With a transparent glass cover of 10 mils thick, glass adhesive 2 mils thick, a support structure 20 mils thick and 4 mil tape, a total package thickness of 36 mils is achieved. Depending on stiffness requirements and the type of support structure 17 material used, the thickness of support structure may be reduced until the bottom of transparent cover almost contacts the top surface of die 11, further reducing the thickness of integrated circuit package 10.

Figure 2:
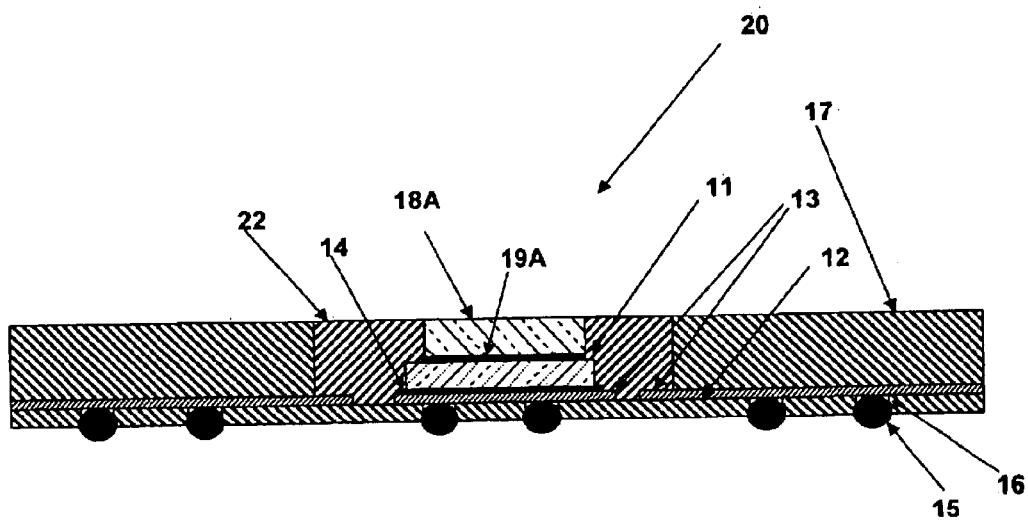
FIG. 2 depicts a cross section of an integrated circuit package in accordance with an alternative embodiment of the present invention.

Referring now to FIG. 2, an optical integrated circuit package 20, in accordance with an alternative embodiment of the invention is depicted. In the alternative embodiment, transparent cover 18A is bonded directly to die 11, using an optically transparent adhesive layer 19A. (In general, it is desirable that adhesive layer 19A provide an optical match between transparent cover 18A and die 11 and such adhesives are commonly available having a variety of refractive indices.) Alternatively, if the entire top surface of die is not optically active, a non-transparent adhesive may be used to bond the edges of die 11 to transparent cover 18A.

As described above for the embodiment of FIG. 1, Die 11 is mounted within an aperture in a support structure 17, which is bonded by an adhesive 14 to a flexible plastic tape 12 having metal conductors 13 disposed thereon. The electrical interface to die 11 is provided by a plurality of solder balls forming a ball grid array on the bottom side of tape 12.

After die 11 and support structure 17 are applied to tape 12, and after transparent cover 18A is mounted to die 11 (transparent cover 18A may be mounted to die 11 just after singulation of die 11 and prior to bonding to tape 12), an encapsulant is applied between the die-cover assembly and the aperture walls in support structure 17, to fill the void between die-cover assembly and support structure 17. The above encapsulation yields an integrated circuit package 17, wherein the total package thickness is determined by the transparent cover 18A thickness, die 11 thickness and tape 12 thickness. The top surface of transparent cover 18A may be made conformal with the top surface of support structure 17, and the thickness of support structure 17 may be only that thickness required to match the top surface of transparent cover 18A.

In general, an optical integrated circuit package having a thickness less than 0.03 inches may be achieved using the above-described method and assembly. With a transparent glass cover of 10 mils thick, glass adhesive 2 mils thick, die thickness of 11 mils, die adhesive 1.5 mils thick and 4 mil thick tape, a total package thickness of 26.5 mils is achieved.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An optical integrated circuit, comprising:
   a flexible plastic tape having a conductive pattern disposed on a top surface thereof;
   a die mounted to the top surface of the tape and electrically coupled to the conductive pattern for providing an electronic function of the integrated circuit;
   a support structure surrounding the die and bonded to the top surface of the tape;
   a transparent cover mounted over the die such that an optically active surface of the die is accessible through the transparent cover; and
   a plurality of external contacts disposed on a bottom surface of the tape opposite the top surface and electrically coupled to the conductive pattern through holes formed in the tape from the bottom surface to the top surface, for providing an electrical interface to the die.

2. The optical integrated circuit of claim 1, wherein the tape is a polyimide tape.

3. The optical integrated circuit of claim 1, wherein the conductive pattern comprises an etched copper pattern on the top surface of the flexible plastic tape.

4. The optical integrated circuit of claim 1, wherein the support structure is a thin metal sheet having an aperture for accepting the die.

5. The optical integrated circuit of claim 1, wherein the support structure is a thin epoxy film.

6. The optical integrated circuit of claim 1, wherein the transparent cover is bonded to the die by an optically transparent adhesive to form an integrated covered die, and further comprising an encapsulant disposed between the support structure and the covered die.

7. The optical integrated circuit of claim 6, wherein a surface of the transparent cover opposite the die is substantially conformal to a top surface of the support structure opposite the tape.

8. The optical integrated circuit of claim 1, wherein the transparent cover is bonded to a top surface of the support structure.

9. The optical integrated circuit of claim 1, wherein the transparent cover is a glass cover.

10. The optical integrated circuit of claim 1, wherein the plurality of electrical contacts are solder balls forming a ball grid array, and wherein the tape is perforated to accept a portion of the solder balls.

11. The optical integrated circuit of claim 10, wherein the conductive pattern is disposed on the top surface of the tape opposite the solder balls and wherein the solder balls contact the conductive pattern through the perforations.

12. The optical integrated circuit of claim 1, further comprising a plurality of wires for electrically coupling the die to the conductive pattern, wherein the wires are bonded to the conductive pattern and the die.

13. The optical integrated circuit of claim 1, further comprising means for mounting the transparent cover over the die.

14. The optical integrated circuit of claim 1, wherein the support structure surrounding the die is a thin metal support structure having an aperture for accepting the die.

* * * * *